(12) United States Patent
Broyles

(10) Patent No.: US 6,383,606 B2
(45) Date of Patent: *May 7, 2002

(54) SEMICONDUCTOR WAFER DIAPHRAGM

(76) Inventor: Michelle Broyles, P.O. Box 25533, Prescott Valley, AZ (US) 88312-5533

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/243,660

(22) Filed: Feb. 2, 1999

(51) Int. Cl.[7] .................................................. B26F 3/00
(52) U.S. Cl. ........................ 428/156; 428/161; 428/166; 414/935; 414/941
(58) Field of Search ................................ 428/64.1, 156, 428/157, 161, 166; 414/935, 941; 451/287, 289, 290, 364, 313, 314; 225/94, 96; 438/464

(56) References Cited

U.S. PATENT DOCUMENTS

| | | | |
|---|---|---|---|
| 5,244,509 A | * | 9/1993 | Arao et al. .................. 136/259 |
| 5,316,853 A | | 5/1994 | Shibata et al. .............. 428/416 |
| 5,538,771 A | | 7/1996 | Nakayama et al. ........ 428/41.3 |
| 5,762,744 A | | 6/1998 | Shibata et al. .............. 156/235 |
| 5,769,692 A | * | 6/1998 | Pasch et al. .................. 451/41 |
| 5,931,719 A | * | 8/1999 | Nagahara et al. ............. 451/41 |
| 5,961,169 A | * | 10/1999 | Kalenian et al. ........... 294/64.1 |
| 6,074,288 A | * | 6/2000 | Nagahara et al. ........... 451/384 |
| 6,180,738 B1 | * | 1/2001 | Wang et al. ................. 526/200 |

* cited by examiner

Primary Examiner—Blaine Copenheaver
Assistant Examiner—Alicia Chevalier
(74) Attorney, Agent, or Firm—The Halvorson Law Firm

(57) ABSTRACT

A semiconductor wafer diaphragm comprising a non-flat film coupled to a mounting lip is disclosed. The semiconductor wafer diaphragm is useful for reducing the edge fracture of semiconductor wafer die due to sagging of prior art semiconductor wafer tape after a semiconductor wafer adhered thereto is cut. The non-flat film of the semiconductor wafer diaphragm preferably has a surface of a convex shape and is either inherently sticky or has an adhesive layer applied to said surface. The semiconductor wafer diaphragm is used by mounting an uncut semiconductor wafer to the diaphragm in the ordinary way thereby collapsing the diaphragm, cutting the semiconductor wafer, thereafter restoring the diaphragm to the original expanded shape of the semiconductor wafer diaphragm, and removing the individually created die.

11 Claims, 4 Drawing Sheets

SEMICONDUCTOR WAFER DIAPHRAGM

FIELD OF THE INVENTION

The present invention relates to the field of semiconductor wafer preparation. More particularly, the present invention relates to the field of devices that secures semiconductor wafers to work surfaces, such as cutting and dicing machines.

BACKGROUND

It is ordinary in the art to adhere a semiconductor wafer to tape prior to sawing or cutting the semiconductor wafer into individual die or sub-units. This is done by applying one side of an adhesive tape, such as double-sided sticky tape, to a holder, leaving the remaining side available. The wafer is then placed on the available side of the adhesive tape. The tape, hereinafter referred to as semiconductor wafer tape, secures the individual sub-units in place after cutting and facilitates subsequent handling.

An occurring problem with handling the wafer after the cutting process is sub-unit edge fracture. Wafer sub-unit edge fracture occurs when edges of adjacent wafer sub-units collide. Since these sub-units are extremely thin, the slight force generated by adjacent edge collisions is sufficient to chip or fracture the edges of the sub-units. Edge fracture is primarily due to the redistribution of the wafer weight after cutting. For instance, when the wafer is first placed upon the wafer handling chuck of a wafer handling machine and secured by the wafer tape, the weight is evenly distributed. However, after cutting, the weight of each sub-unit is now distributed only across the area of the tape in contact with the wafer sub-unit. This effect, when applied to each of the sub-units produced by cutting the wafer, causes an overall sagging of the tape across the wafer handling chuck of a wafer handling machine. It is this sagging of the tape that allows the edges of adjacent sub-units to be driven toward each other, frequently resulting in destructive collisions. Therefore, it is desirable to reduce edge fracture or suffer the loss of otherwise viable sub-units.

Ordinarily, to combat sub-unit edge fracture and to otherwise facilitate wafer sub-unit handling, the semiconductor industry uses stretchable wafer tape. Stretchable tapes and methods of using the same are disclosed respectively by Shibata et al. in U.S. Pat. No. 5,316,853 and in U.S. Pat. No. 5,762,744. Moreover, U.S. Pat. No. 5,538,771 issued to Nakayama, et al., also discloses a stretchable semiconductor wafer tape. To use the stretched tapes disclosed in these patents, an uncut semiconductor wafer must first be adhered to the un-stretched wafer tape by any one of a variety of methods.

In one method of applying stretchable wafer tape to a semiconductor wafer, a tape application machine having a tape application diaphragm applies the stretchable semiconductor wafer tape to the back of a semiconductor wafer. In this method, a portion of stretchable semiconductor wafer tape is positioned between a collapsed diaphragm and a of semiconductor wafer. By expanding the machine diaphragm, the stretchable semiconductor wafer tape is brought into contact with the back of the semiconductor wafer, starting at the center of the wafer and gradually moving from the inside of the wafer towards the perimeter of the uncut semiconductor wafer. By gradual application of the stretchable wafer tape from the inside out, the occurrence of air bubbles between the tape and the wafer can be reduced.

Manual methods of applying stretchable wafer tape to the back of semiconductor wafers also exist. For instance, one method uses ring devices that snap together with portion stretchable wafer tape between the ring devices. The action of snapping the rings together over the stretchable semiconductor wafer tape pulls the wafer tape flat before attachment of the semiconductor wafer. Another method of applying stretchable semiconductor wafer tape involves manual application of the wafer tape to the backside of a semiconductor wafer. In this method, a person brushes or wipes the wafer tape onto the backside of the semiconductor wafer using outwardly concentric motions. As it was in the case of the tape application machine discussed above, the goal of both of these manual methods is also to reduce the likelihood of bubbles being trapped between the stretchable wafer tape and the semiconductor wafer.

After the stretchable wafer tape is applied to the uncut semiconductor wafer, the uncut wafer is cut into multiple sub-units leaving the film of the stretchable tape generally intact. Thereafter, placing a tension across the stretchable tape expands the tape and separates the edges of adjacent sub-units. Thereafter, a die-picking machine is used to handle the physically separated individual sub-units. In use, stretchable wafer tape reduces edge fracture of adjacent sub-units by pulling apart, or stretching horizontally, the tape to which the sub-units are adhered.

One shortfall of using the stretchable tape disclosed is the step required for stretching these wafer tapes. Generally, a tensile force must be applied to the stretchable tape to cause the tape to stretch. The equipment required to apply the tensile force can be expensive or difficult to set up. Moreover, the manufacture of stretchable tape can be fairly complex and accordingly expensive. Therefore, there is a need for a device, such as a new semiconductor wafer diaphragm, that is inexpensive but solves the problem of sub-unit edge fracture. The present invention promotes the reduction of sub-unit edge fracture in an inexpensive manner and permits the continued use of ordinary semiconductor wafer handling equipment.

SUMMARY OF THE INVENTION

It is an object of the present invention to reduce semiconductor die or sub-unit edge fracture using a semiconductor wafer diaphragm.

It is a further object of the present invention to reduce semiconductor die or sub-unit edge fracture using a semiconductor wafer diaphragm and ordinary semiconductor wafer handling equipment.

BRIEF DESCRIPTION OF THE DRAWINGS

The novel features that are considered characteristic of the invention are set forth with particularity in the appended claims. The invention itself, however, both as to its structure and its operation together with the additional object and advantages thereof will best be understood from the following description of the preferred embodiment of the present invention when read in conjunction with the accompanying drawings wherein:

DESCRIPTION OF PREFERRED EMBODIMENTS

Figure 1:
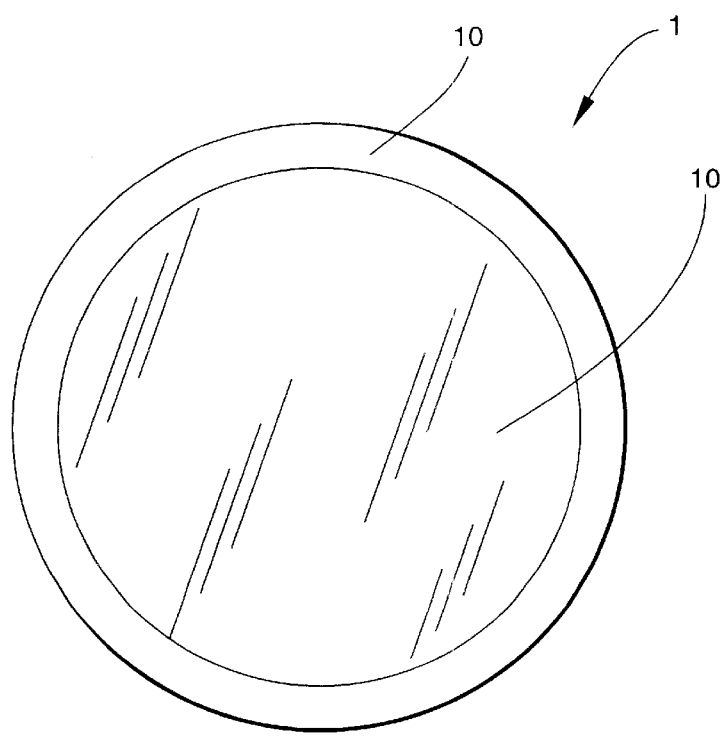
FIG. 1 depicts a top view of the subject invention.
Figure 2:
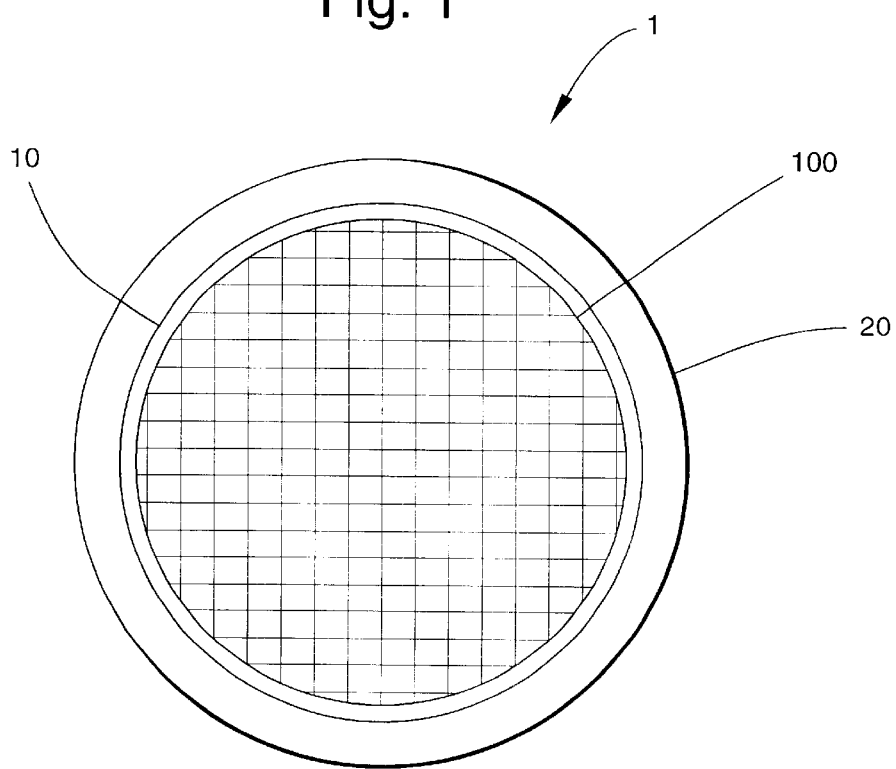
FIG. 2 depicts a top view of the subject invention with a semiconductor wafer placed thereupon.
Figure 3:
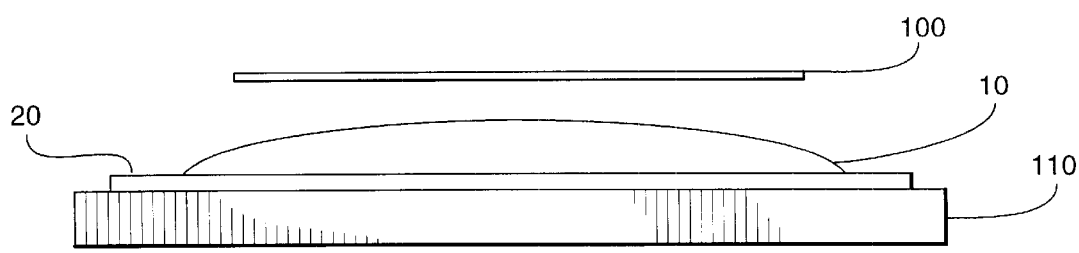
FIG. 3 depicts the first event in a sequence of events ending with FIG. 7; a semiconductor wafer about to be placed on the diaphragm.
Figure 4:
FIG. 4 depicts the second event in the sequence; a semiconductor wafer coming into contact with the diaphragm.
Figure 5:
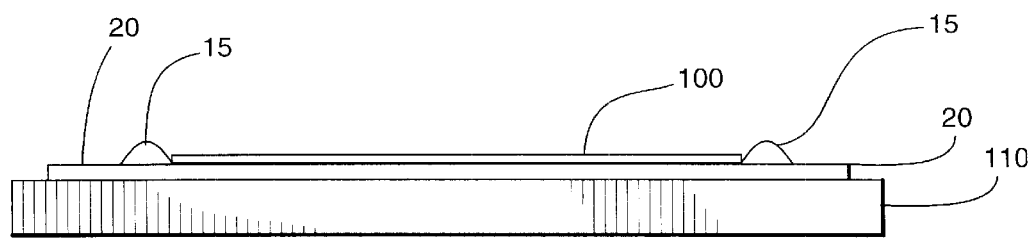
FIG. 5 depicts the third event in the sequence; the diaphragm collapsed with the semiconductor wafer adhered thereupon.
Figure 6:
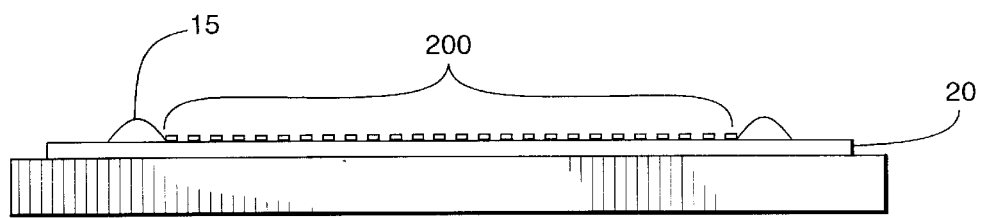
FIG. 6 depicts the fourth event in the sequence; the diaphragm collapsed with the individual semiconductor die or sub-units adhered thereupon.
Figure 7:
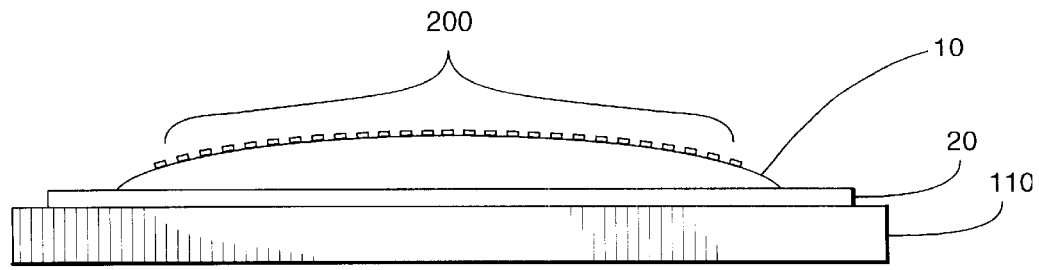
FIG. 7 depicts the fifth event in the sequence; the diaphragm restored and the individual semiconductor die or sub-units adhered thereupon.
Figure 8:
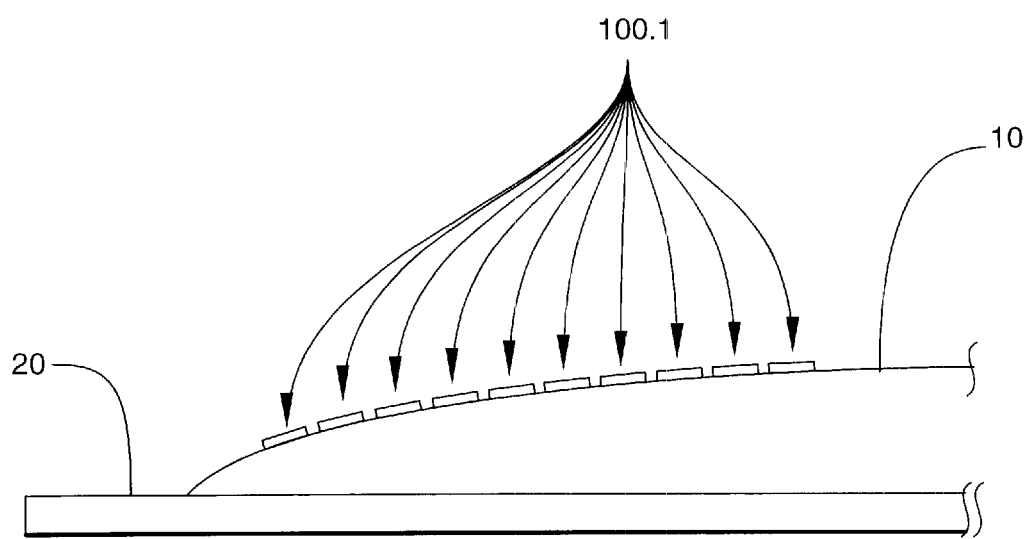
FIG. 8 depicts a side view of the diaphragm with the individual or sub-units thereupon.

The subject invention is a semiconductor wafer diaphragm 1 comprising a non-flat film 10 coupled to a mounting lip 20. The diaphragm 1 according to the present invention is useful for reducing the collision-induced fracture of the adjacent edges of wafer sub-units 200, or die, cut from a semiconductor wafer 100. Prior to the wafer cutting procedure, the diaphragm 1 is mounted to the semiconductor wafer 100 using methods ordinary in the art. However, after the cutting procedure, the diaphragm 1 exploits in a novel way the ability of a wafer handling chuck 110 of an standard semiconductor industry wafer handling machine 111 to create a positive air pressure differential at the surface of said wafer handling chuck 110.

The non-flat film 10 of the subject invention is preferably a plastic film having two sides, a first side 11, and a second side 12, that is preferably made from a flexible polymeric, or elastomeric, sufficiently rigid to provide a stable expanded condition and a stable collapsed condition. Moreover, said stable expanded condition of said non-flat film 10 should be maintainable with the weight of a semiconductor wafer 100 thereon without an air pressure differential between said first side 11 and said second side 12. Moreover, said stable collapsed condition of said non-flat film 10 should be achievable with the air pressure differential capable of being created by the wafer handling chuck 110 of a standard semiconductor industry wafer handling machine 111.

While other non-flat shapes for the non-flat film 10 are contemplated, the preferred 20 non-flat film 10 has a convex form or shape. However, notwithstanding the shape used, it is critical to the present invention that a portion of the non-flat film 10 projects beyond the conceptual plane containing the mounting lip 20. For a non-flat film 10 that is convex in shape, said first side 11 is the outer surface of the convex shape.

In one embodiment, the material of the non-flat film 10 has a minimum of inherent stickiness or tackiness a sticky polymer. The minimum stickiness or tackiness would be the amount sufficient to cause an adhered semiconductor wafer 100 to remain in place during the cutting operation. Stickiness less than this minimum would allow the wafer 100 to move during the cutting operation thereby ruining subsequent cuts. Another embodiment features a thin later of adhesive film 13 applied to the first side 11 of the non-flat 10 using any one or combination of the wide variety of semiconductor wafer adhesives that are commonly available in the industry. Also, though not perferably, one side of an adhesive tape, such as double-sided sticky tape, could be attached to the first side 11 of the non-flat film 10 with the remaining side of said double-sided stick tape used to securely hold the wafer 100.

The mounting lip 20 of the diaphragm 1 is coupled to the perimeter of the non-flat film 10 of the diaphragm 1 by an ordinary adhesive capable of forming a substantially airtight bond between the mounting lip 20 and the non-flat film 10. Alternately, the mounting lip 20 may be integrally formed to the non-flat film 10 as would occur during injection molding manufacture of the present invention. The lip 20 functionally forms a substantial seal between the diaphragm 1 and a wafer chuck 110 when air is drawn out from underneath diaphragm 1 through the wafer handling chuck 110 of the handling machine 111.

To withstand the pressure gradient of the diaphragm 1, the mounting lip 20 is rigid or preferably semi-rigid. Also, the rigidity of the mounting lip 20 serves as a support for the non-flat film 10, and any adhered wafer sub-units 200, during transfer of the diaphragm 1 between different machines. To secure the diaphragm 1 to the wafer handling chuck 110, the mounting lip 20 has as least one smooth surface that substantially contacts the wafer handling chuck 110. The smooth surface promotes a substantially airtight seal between the mounting lip 20 and an external or sealing surface of the wafer handling chuck 110 when air is drawn from underneath the diaphragm 1 by the wafer handling chuck 110. Materials capable of being used for the mounting lip 20 are plastic, metal, glass, ceramics, cardboard, or any other material capable of being formed into a smooth, rigid or semi-rigid lip.

Preferably, the subject invention is used with a wafer handling chuck 110. However, any other comparable device with a flat surface larger than the perimeter of the mounting lip 20, capable of passing air from beneath the diaphragm 1 can also be used. Therefore, the diaphragm 1 will work with most standard semiconductor wafer handling chucks without the need for modification, and with most other semiconductor wafer chucks after only minor modification.

Methods ordinary in the art for creating plastic convex surfaces can be used to create the non-flat shape of the non-flat film 10 of the diaphragm 1. For example, one method uses at least two plastic film layers with different thermal expansion characteristics adhered together and cut to a size suitable for holding a semiconductor wafer 100. Said layers are then subject to heating and thereafter allowed to set at room temperature. Since the surface area of the at least two plastic film layers will change differently during heating, the layers will become non-flat or convex. Thereafter, cooling the layers can set the convex shape of the layers.

Another method of creating a convex shape is to cut a piece of a single layer of plastic film and subject said piece of a single layer of plastic film to a dome shaped temperature gradient that changes as the center of the plastic film is reached. Since the inner area of plastic film is a different temperature than the outer area of said plastic film; the inner area will expand differently than the outer area, thereby creating a non-flat piece of plastic film. Thereafter, cooling the plastic film can set the convex shape. Yet other ordinary methods are extrusion of a plastic resin into a mold and thermally setting a polymeric film across a bas-relief mold.

In use, the diaphragm 1 is preferably applied to an uncut semiconductor wafer 100 in a way ordinary in the art using wafer tape application machines that are ordinary in the art. That is, the diaphragm 1 may be used with and applied by an automated tape application machine, or by manual application. In either case, the diaphragm 1 collapsed when it is applied to the wafer 100. Therefore, the goal remains to adhere the diaphragm 1 to the wafer 100 and limit the capture of air bubbles beneath the diaphragm 1. After the diaphragm 1 has been applied in the way that wafer tape is ordinarily applied, the semiconductor wafer 100 and the adhered diaphragm 1 can be further processed or handled in ways ordinary for semiconductor wafers at this stage of semiconductor wafer 100 processing.

In another, though not preferred, method of applying the diaphragm 1 to a semiconductor wafer 100, an uncut semiconductor wafer 100 is first placed upon and adhered to the tacky tape surface 10 of an expanded diaphragm 1 within the perimeter of the mounting lip 20. However, since the tape surface 10 is expanded, and preferably convex, the entire surface area of the semiconductor wafer 100 will not touch the corresponding surface area of the tape surface 10. Instead, only the center area of the semiconductor wafer 100 will balance on the center area of the convex tape surface 10. FIG. 1 depicts this phenomenon. Next the diaphragm tape 1 carrying the semiconductor wafer 100 is placed upon a wafer handling chuck 110 with the perimeter of the mounting lip 20 surrounding the wafer handling chuck 110 air path. Air is drawn from underneath the diaphragm 1 though the wafer chuck air path thereby collapsing or contracting the diaphragm 1 and creating a level surface contacting substantially the entire bottom surface of the semiconductor wafer 100 with a corresponding amount of tape surface area. The semiconductor wafer 100 on the now collapsed diaphragm 1 can be cut in the ordinary fashion whereby the tape to which the semiconductor wafer 100 is adhered is not appreciably cut.

Notwithstanding the method of applying the diaphragm 1 to the semiconductor wafer 100, since the area of a non-flat, or curved, surface is greater than that same surface projected on a flat surface, a temporary circular ridge 15, or fold, of excess plastic film on the perimeter of the non-flat film 10 will be created. The actual area of plastic contained by the circular ridge 15 is heavily dependent upon the rigidity and thickness of the plastic, but is approximately the difference in surface area between the non-flat surface and the flat surface projection of the non-flat surface. Preferably, the non-flat film 10 area is large enough so that the ridge 15 of plastic is created beyond the perimeter of the semiconductor wafer 100 when the non-flat film 10 of the diaphragm 1 flattens.

Typically, after a semiconductor wafer 100 having prior art wafer tape adhered is cut, it is ordinary to dislodge the cut wafer 100 from the wafer handling chuck by temporarily creating a positive air pressure differential under the cut wafer 100 and adhered prior art wafer tape. Likewise, when a diaphragm 1 is used as an alternative to prior art wafer tape, said positive air pressure differential should also be created. However, in the case when a diaphragm 1 is used, creating the positive air pressure differential beneath the diaphragm 1 with the wafer handling chuck 110 will inflate and expand the diaphragm 1 and thereby beneficially reducing the probability that wafer sub-unit 200 edges will collide and fracture.

After cutting, the wafer sub-units 200 are each separately adhered to the first side 11 of the diaphragm 1. Next, the diaphragm 1 is inflated or expanded by creating a positive air pressure differential beneath the diaphragm 1 with the wafer handling chuck 110. Since the surface area of the expanded non-flat film 10 of the diaphragm 1 is greater than the surface area of the flat projection of the formerly uncut semiconductor wafer 100, the expansion of the diaphragm 1 to the expanded non-flat shape will draw apart the edges of the wafer sub-units 200 thereby significantly diminishing the chances that sub-unit 200 edges collide and fracture. Thereafter, an ordinary die-picking machine can remove the individual sub-units 200.

While these descriptions directly describe the above embodiments, it is understood that those skilled in the art may conceive modifications and/or variations to the specific embodiments shown and described herein. Any such modifications or variations that fall within the purview of this description are intended to be included therein as well. It is understood that the description herein is intended to be illustrative only and is not intended to be limitative. Rather, the scope of the invention described herein is limited only by the claims appended hereto.

What is claimed is:

1. A semiconductor diaphragm and wafer handling chuck for use in semiconductor wafer processing comprising a non-flat film having a first side and a second side coupled at a perimeter to a mounting lip, a portion of said non-flat film further projects beyond the mounting lip, and said non-flat film is sufficiently rigid to have a stable expanded condition and a stable collapsed condition, wherein a semiconductor wafer is maintained on said non-flat film in said stable expanded condition without a pressure differential between the first side and the second side and said collapsed condition is achieved by a pressure differential between the first side and the second side.

2. The semiconductor diaphragm and wafer handling chuck of claim 1 wherein the non-flat film is comprised of at least one layer of a sticky film comprising a polymer.

3. The semiconductor diaphragm and wafer handling chuck of claim 1 wherein said first side further has an adhesive layer applied to that portion of said first side that projects beyond the mounting lip.

4. The semiconductor diaphragm and wafer handling chuck of claim 1 wherein the non-flat film is coupled to the mounting lip with an adhesive.

5. The semiconductor diaphragm and wafer handling chuck of claim 1 wherein the non-flat film is integrally formed to the mounting lip.

6. The semiconductor diaphragm and wafer handling chuck of claim 1 wherein the mounting lip is a rigid ring.

7. The semiconductor diaphragm and wafer handling chuck of claim 6 wherein the mounting lip is made from a plastic material.

8. The semiconductor diaphragm and wafer handling chuck of claim 7 wherein the non-flat film is substantailly convex in shape.

9. The semiconductor diaphragm and wafer handling chuck of claim 1 wherein the mounting lip is a semi-rigid ring.

10. The semiconductor diaphragm and wafer handling chuck of claim 9 wherein the mounting lip is made from a plastic material.

11. The semiconductor diaphragm and wafer handling chuck of claim 10 wherein the non-flat film is substantially convex in shape.

* * * * *